United States Patent
Ooaeh et al.

[11] Patent Number: 6,055,719
[45] Date of Patent: May 2, 2000

[54] METHOD FOR MANUFACTURING AN ELECTROSTATIC DEFLECTOR

[75] Inventors: Yoshihisa Ooaeh; Tomohiko Abe; Hiroshi Yasuda, all of Kawasaki, Japan

[73] Assignee: Fujitsu Limited, Kawasaki, Japan

[21] Appl. No.: 09/035,105

[22] Filed: Mar. 5, 1998

Related U.S. Application Data

[62] Division of application No. 08/758,824, Dec. 4, 1996, Pat. No. 5,770,862.

[30] Foreign Application Priority Data

Apr. 26, 1996 [JP] Japan .................................. 8-107384

[51] Int. Cl.⁷ .................................................. G09F 21/04
[52] U.S. Cl. ............................ 29/592.1; 250/396 ML; 250/396 R; 250/397; 250/398; 250/492.1; 250/492.2
[58] Field of Search .................... 29/592.1, 868; 204/192.12, 192.13; 250/492.2, 396 R, 492.1, 396 ML, 397, 398

[56] References Cited

U.S. PATENT DOCUMENTS

| | | | |
|---|---|---|---|
| 3,340,603 | 9/1967 | Charles ................................. | 29/592.1 |
| 3,824,170 | 7/1974 | Weelink et al. ...................... | 29/592.1 |
| 3,832,760 | 9/1974 | Scott, Jr. .............................. | 29/25.14 |
| 4,525,629 | 6/1985 | Morita et al. ....................... | 250/396 ML |
| 5,041,731 | 8/1991 | Oae et al. ........................... | 250/396 ML |
| 5,134,419 | 7/1992 | Egashira .............................. | 343/722 |
| 5,393,988 | 2/1995 | Sakamoto ........................... | 250/492.22 |
| 5,444,256 | 8/1995 | Nagai et al. ........................ | 250/396 R |
| 5,478,456 | 12/1995 | Humpal et al. .................... | 204/192.13 |

FOREIGN PATENT DOCUMENTS

| | | |
|---|---|---|
| 2-247966 | 3/1990 | Japan . |
| 2-192117 | 7/1990 | Japan . |
| 03237715A | 10/1991 | Japan . |
| 05029201A | 2/1993 | Japan . |
| 05129193A | 5/1993 | Japan . |
| 6-325709 | 11/1994 | Japan . |

*Primary Examiner*—Lee Young
*Assistant Examiner*—Binh-An Nguyen
*Attorney, Agent, or Firm*—Staas & Halsey, LLP

[57] ABSTRACT

The present invention relates to a charged particle beam exposure apparatus, deflecting a charged particle beam formed into a predetermined shape by being passed through a predetermined transmission mask, and irradiating a predetermined location on the surface of a sample with the charged particle beam. The apparatus comprises: a mirror barrel through which the charged particle beam is passed; and an electrostatic deflector, provided in the mirror barrel, for deflecting the charged particle beam. The electrostatic deflector has a plurality of pairs of electrodes, which are made of a conductive material having carbon as a primary element and are embedded in an internal face of an insulating cylinder. The present invention also relates to a method for forming the electrostatic deflector.

3 Claims, 13 Drawing Sheets

FIG. 1 EB APPARATUS

EB APPARATUS

SUB-DEFLECTOR 34

METHOD FOR MANUFACTURING AN ELECTROSTATIC DEFLECTOR

This application is a division of 08/758,824, filed Dec. 4, 1996, now U.S. Pat. No. 5,770,862.

BACKGROUND OF THE INVENTION

1. Field of the Invention

The present invention relates to a charged particle beam exposure apparatus, and especially to the structure of an electrostatic deflection electrode; and to a method for manufacturing a charged particle beam exposure apparatus.

2. Related Arts

A charged particle beam exposure method using an electron beam or an ion beam is a known technique for exposing a fine pattern on the surface of a rectile during the forming of a semiconductor wafer or a mask. The charged particle beam exposure apparatus projects a charged particle beam, which is emitted by a charged particle beam gun, through a predetermined transmission mask, to form a beam whose cross section is a pattern to be exposed, and irradiates the surface of a sample with the beam. In this case, the beam must be deflected to a predetermined location of the sample surface.

For the deflection of the charged particle beam, there is employed a combination of an electromagnetic deflector, which sharply deflects a charged particle beam away from the center axis of the mirror barrel of an exposure apparatus, and an electrostatic deflector, which deflects a charged particle beam only slightly in a narrow region in the vicinity of the area in which deflection takes place. Although the electrostatic deflector, which is also called a sub-deflector, provides only a slight deflection effect, it uses only a comparatively low voltage for beam deflection, and it can increase the deflection speed. Conversely, although the electromagnetic deflector, which is also called a main deflector, provides a large deflection effect, deflecting a beam comparatively sharply, it requires a long setting time for beam deflection, and, as a result, it reduces deflection speed.

In the mirror barrel of an exposure apparatus, there must be provided, from the top, a charged particle beam gun, a primary transmsison mask, a secondary transmission mask, and the deflectors. In order to reduce the size of the mirror barrel, the electrostatic deflector and the electromagnetic deflector are overlapped in the portion wherein a projection lens is provided, immediately before the position for a sample is reached. Taking into consideration the relationship between a magnetic field and an electric field, the electrostatic deflector is located in a sealed cylinder in which is maintained a vacuum through which the charged particle beam passes, while the electromagnetic deflector and the projection lens (electromagnetic lens) are exposed to the external atmosphere.

The design for the electrostatic deflector calls for an arrangement of eight long cylindrical electrodes, for example, with a predetermined voltage being applied between each pair of facing electrodes. By applying a voltage to the four electrode pairs, it is possible to set as desired a deflection direction in a narrow sub-deflection region.

The present applicant proposed an electrostatic deflector described in U.S. Pat. No. 5,041,731 or in Japanese Unexamined Patent Publication Nos. Hei 2-247966 and 2-192117.

For an electrode of the electrostatic deflector, a ceramic is shaped into a cylinder and a groove is formed in the internal surface of the cylinder. The ceramic cylinder is then fired. After that, metal plating is performed to cover the entire internal surface of the cylinder formed of an insulating material, following which the plated layer in the groove is peeled away by an electric discharge. The electrodes are thus electrically separated to provide a plurality of pairs of electrodes. Unlike the metal electrodes, the thus produced electrostatic deflector electrodes has only plated metal layers on the surface of the ceramic. This can prevent an eddy current, which occurs due to changes in the magnetic field produced by the electromagnetic deflector located outside the electrostatic deflector.

However, the electrode structure for which metal plating is performed on the surface of the ceramic has the following problems.

First, since the procedure for the production of electrodes provides for extruded clay to be dried before it is fired, the shape of the clay electrodes has changed during being dried and by the time they are ready for firing. With eight electrodes, for example, the symmetry of their relationship will be lost, their sizes will differ, and their bodies will be twisted and deformed. Furthermore, during the firing process the same size changes occur. As a result of such size changes, beams are defocused and the aberrant deflection of beams occurs. In addition, the twisting of the bodies of the electrodes causes sub-deflection directions to be changed.

Second, it is known that since the electrostatic deflection electrodes are positioned the nearest to the sample, a resist made of an organic material coated on the surface of the sample is vaporized when irradiation with a beam is performed, and as a result a contaminant is deposited on the surfaces of the electrodes. Also, scattered electrons that are generated by the irradiation of charged particles may strike organic material in the vacuum and cause contaminants to be attached to the surfaces of the electrodes. Such contamination of the electrodes causes a charge-up on the electrode surfaces; it also results in the deterioration of the accuracy with which beams are deflected and in the defocusing of beams.

In order to eliminate the contamination, the present inventors proposed a method for cleaning the surfaces of components in an exposure apparatus by performing plasma excitation of oxygen that is introduced into the apparatus (e.g., Japanese Patent Application No. Hei 5-138755). With this cleaning method, however, since the application of a high frequency to a mirror barrel accompanies the generation of plasma, the plating on electrode surfaces is scored by the sputtering of generated ions, and when the cleaning is repeated a number of times, the plated metal layers will be peeled away and the ceramic will be exposed. Thereafter, a charge buildup will occur relative to the exposed ceramic. It was confirmed by the present inventors that even with a plated layer of 1.5 $\mu$m, a charge buildup occurred when cleaning using oxygen was performed more than ten but less than twenty times. As a result, the life expectancy of electrodes is shortened and the ratio relative to the operation of the exposure apparatus is reduced.

Although the problem concerning plated layers can be resolved by forming electrodes of metal, as was previously described, metal electrodes will cause an eddy current due to changes in the magnetic field produced by an electromagnetic deflector. With the occurrence of an eddy current, the time constant for the setting time becomes several msec, and in consonance with this, there is a deterioration in the exposure throughput.

SUMMARY OF THE INVENTION

To resolve the above shortcomings, it is one object of the present invention to provide for an electrostatic deflector an electrode structure that does not generate an eddy current and that can prevent electrodes from acquiring different sizes and from being deformed, and a method for manufacturing such an electrostatic deflector.

It is another object of the present invention to provide a charged particle beam exposure apparatus that has an electrostatic deflector having electrodes that have a long life and an increased ratio of operation.

It is an additional object of the present invention to provide a charged particle beam exposure apparatus with which a buildup of a charge does not occur even when cleaning using oxygen plasma is performed.

To achieve the above objects, according to the present invention, a charged particle beam exposure apparatus, deflecting a charged particle beam formed into a predetermined shape by being passed through a predetermined transmission mask, and irradiating a predetermined location on the surface of a sample with the charged particle beam, comprises:

a mirror barrel through which the charged particle beam is passed; and an electrostatic deflector, provided in the mirror barrel, for deflecting the charged particle beam, the electrostatic deflector having a plurality of pairs of electrodes, which are made of a conductive material having carbon as a primary element and are embedded in an internal face of an insulating cylinder.

Since deflection electrodes are formed of a conductive material having carbon as a primary element, the surface of the electrodes will not peel away like a plated metal layer even through cleaning using oxygen plasma is performed. Further, since the resistance of carbon is about a hundred times higher than that of metal, an eddy current will not occur on the surfaces of the electrodes even though changes in a magnetic field are produced by an electromagnetic deflector, which is located outside the electrostatic deflector.

Further, according to the above aspect of the present invention, a separation groove formed between each of the plurality pairs of electrodes has an adequately large depth relative to its width. In addition, the separation groove formed between each of the plurality of pairs of electrodes is so shaped that grooves are linked together in at least two different directions. More specifically, a separation groove has a first groove segment formed in the direction of the radius of the insulating cylinder, a second groove segment extending from the first groove segment in the circumferential direction of the insulating cylinder, and a third groove segment extending from the second groove segment in the direction of the radius.

With a separation groove that is thus shaped, even when the internal face of the insulating cylinder is exposed at the bottom ends of the separation grooves and reflected electrons of the charged particles reach there to generate the buildup of a charge, the influence of the electric field due to the charge can be dissipated by the separation grooves. As a result, a difference in deflection due to the charge buildup can be prevented.

To achieve the above objects, according to the present invention, a method for manufacturing an electrostatic deflector, which is provided in a charged particle beam exposure apparatus for deflecting a charged particle beam formed into a predetermined shape by being passed through a predetermined mask, and for irradiating a predetermined location on a surface of a sample with the charged particle beam, comprises the steps of:

shaping into a cylinder a conductive material containing carbon as a primary element and firing the cylinder to form a conductive pipe;

forming external grooves having a predetermined shape which extend from an external face of the conductive pipe to an internal position;

inserting the conductive pipe into the insulating cylinder and fixing the conductive pipe therein;

grinding the internal face of the conductive pipe so as to give the internal face a substantially cylindrical shape; and forming internal grooves which extend from the internal face of the conductive pipe to the external grooves, and with which the conductive pipe is separated into a plurality of pairs of electrodes.

More specifically, when the conductive pipe has been formed, first, the separation grooves are formed in its external face without actual separation of the pipe and it is inserted into the insulating cylinder. The internal surface of the conductive pipe is then ground so that its shape becomes a true circle, coaxially formed with the insulating cylinder. Then, other separation grooves are formed from the internal face of the conductive pipe reaching the external grooves to divide the conductive pipe into a plurality of pairs of electrodes. In this manner, the internal faces of the deflection electrodes, which are most important for an electrostatic deflector, can be accurately sized and not be twisted. As a result, an accurate deflection electric field can be provided.

DETAILED DESCRIPTION OF THE PREFERRED EMBODIMENTS

The preferred embodiment of the present invention will now be described while referring to the accompanying drawings. The technical scope of the present invention is not, however, limited to the preferred embodiment.

[General structure of a charged particle beam exposure apparatus]

Figure 1:
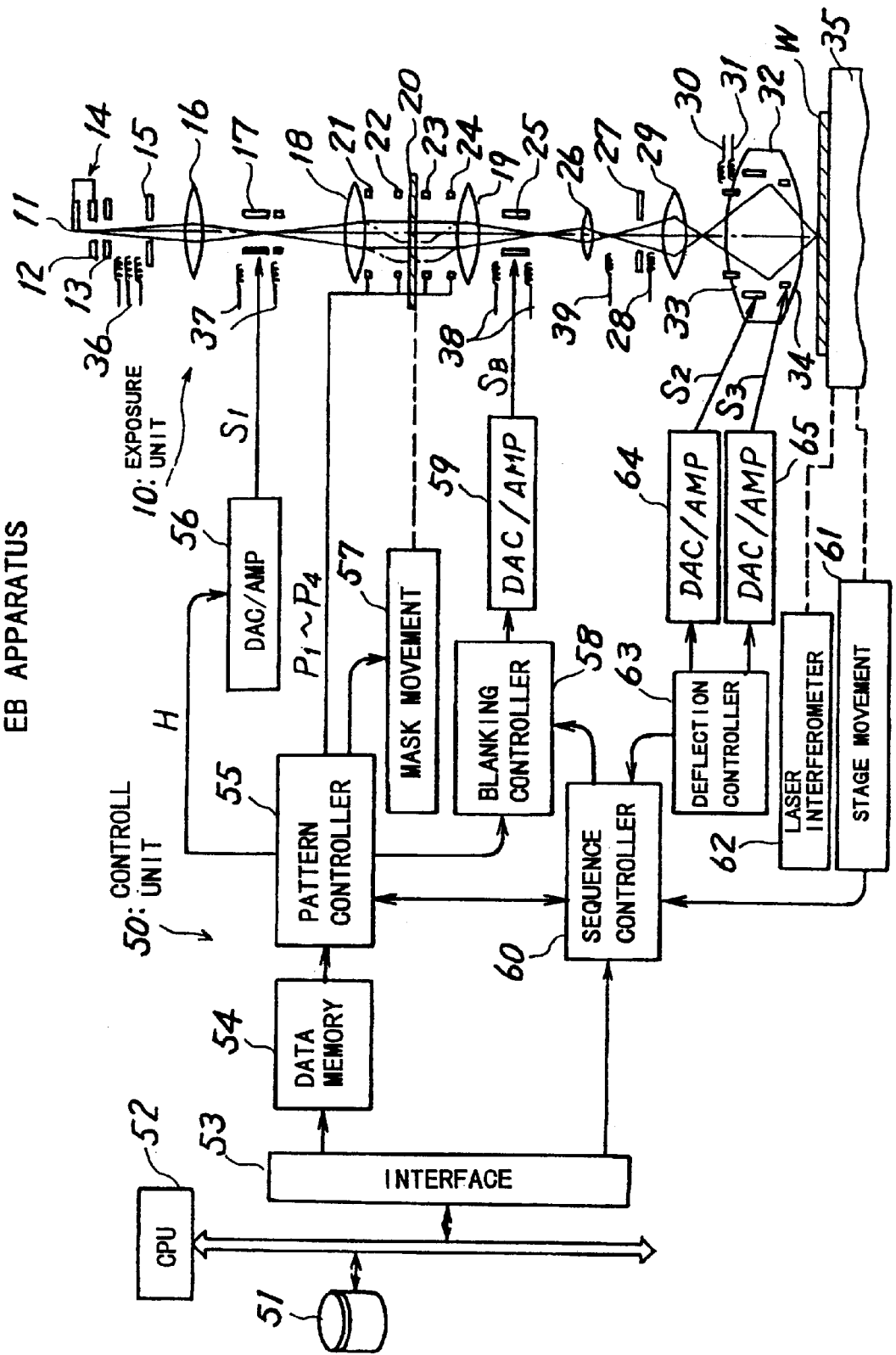
FIG. 1 is a diagram illustrating the general structure of an electron beam exposure apparatus.

FIG. 1 is a diagram illustrating the general structure of an electron beam exposure apparatus. The present invention can be applied to any exposure apparatus that utilizes a charged particle beam, and in this embodiment, an electron beam exposure apparatus is employed as an example. The exposure apparatus comprises an exposure unit 10 and a control unit 50. Pattern data stored in a storage medium 51, such as a disk, are transmitted to the control unit 50 via an interface 53, and are converted into the drive signals that are required for exposure. In consonance with the drive signals, driving of lenses and deflectors in the exposure unit 10 is performed.

Figure 2:
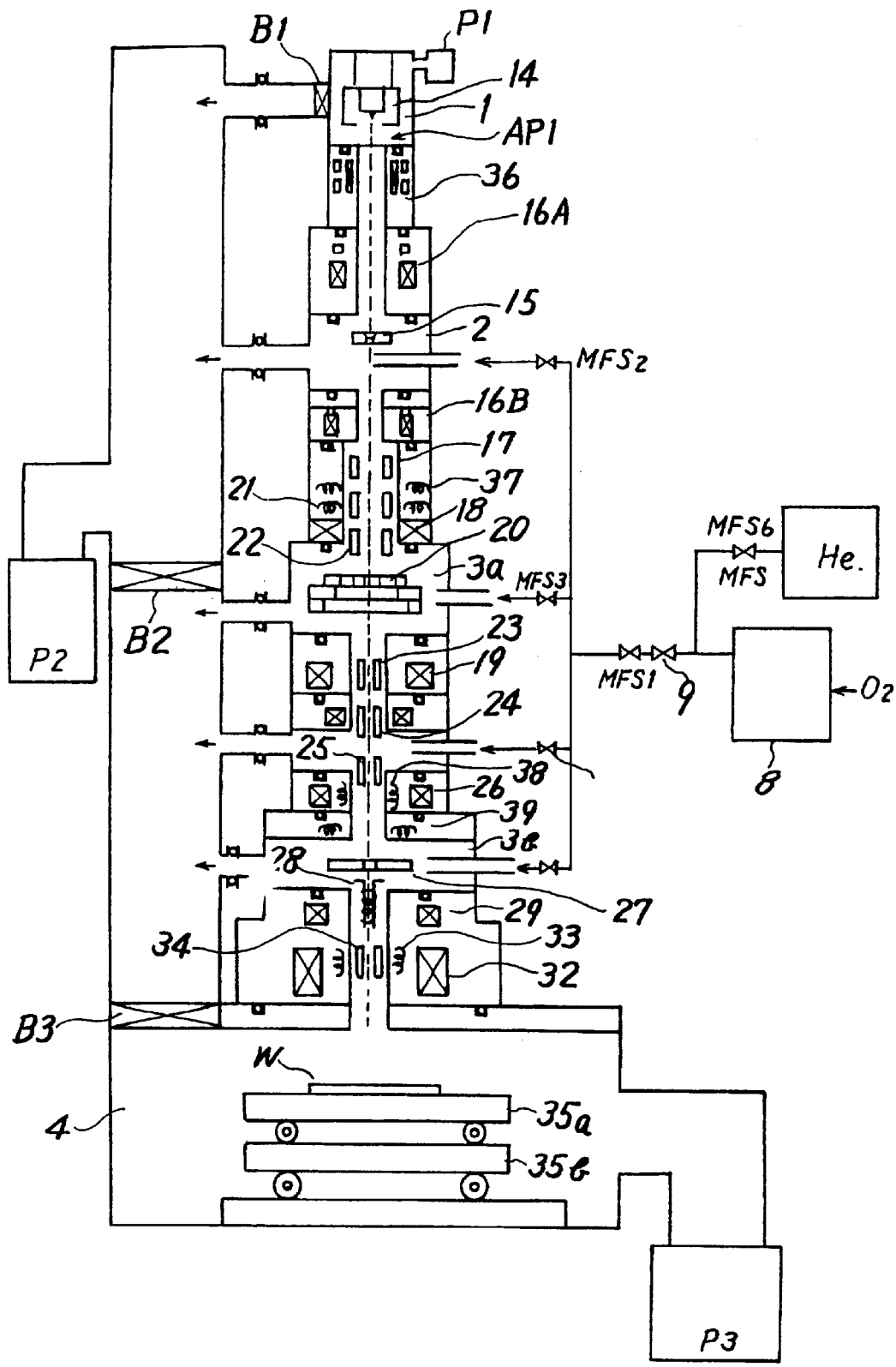
FIG. 2 is a detailed diagram illustrating the beam exposure section of the electron beam exposure apparatus.

FIG. 2 is a detailed diagram illustrating the exposure unit 10. The structure of the exposure unit 10 can be clearly understood from the explanation given while referring to FIG. 2.

The exposure unit 10 will now be described. An electron beam gun 10, an electron beam generator, is constituted by a cathode electrode 11, a grid electrode 12, and an anode electrode 13. An electron beam is projected through alignment coils 36 for axis matching, and lenses 16A (not shown in FIG. 1) to a first slit 15. The first slit 15 normally has a rectangular aperture by which the electron beam is shaped into a rectangle. The rectangular beam enters a slit deflector 17 after passing through lenses 16B. The slit deflector 17 is controlled in consonance with a correction deflection signal S1, and is employed for delicate correction of positions. Reference numeral 37 denotes alignment coils.

In order to shape an electron beam and give it a predetermined pattern, a transmission mask 20 is used that has a plurality of transmission holes, such as a rectangular opening and a block pattern opening having a specific pattern. Therefore, electromagnetic lenses 18 and 19, and deflectors 21 through 24 are located above and below the transmission mask 20 in order to guide the electron beam to the location of a desired pattern opening. It should be noted that the transmission mask 20 is mounted on a horizontally movable stage.

The irradiation of a wafer W by the thus shaped electron beam is controlled by a blanking electrode 25 to which a blanking signal SB is transmitted. Reference numeral 38 denotes other alignment coils.

The electron beam projected in consonance with the control exercised by the blanking electrode 25 passes through lenses 26 and a round aperture 27. The round aperture 27 is one aperture type, and the degree to which it can be opened is adjustable. With this aperture 27, control is provided for the convergence of the half angle of the electron beam. The final beam shape is adjusted by a re-focal coil 28 and electromagnetic lenses 29. A focus coil 30 focuses the electron beam on a surface to be exposed, and a sting coil 31 corrects for astigmatism.

At the final stage, the electron beam is reduced to an exposure size by projection lenses 32, and the correct location on the surface of the wafer W is irradiated with the electron beam by a main deflector 33 and a sub-deflector 34, which are controlled in accordance with exposed position determination signals S2 and S3, respectively. The main deflector 33 is an electromagnetic deflector and the sub-deflector 34 is an electrostatic deflector.

The control unit 50 will now be described. Data for an exposure pattern are stored in the memory 51, are read by a CPU 52, and are computed by a predetermined program. The acquired drawing data are transmitted via the interface 53 to a data memory 54 and a sequence controller 60. The drawing data include at the least data for a position on the wafer W which is to be irradiated with the electron beam, and mask data designating a pattern on the transmission mask 20.

A pattern controller 55 supplies, to the deflectors 21 through 24, position signals P1 through P4, each indicting one of the transmission holes on the transmission mask 20 according to the data for the mask that is to be drawn. The pattern controller 55 also computes correction value H that corresponds to a difference in shape between a pattern to be drawn and a designated transmission hole, and transmits the correction value H to a digital/analog converter/amplifier 56. The amplifier 56 transmits a correction deflection signal S1 to a deflector 17. In addition, the pattern controller 55 controls a mask shifting mechanism 57 to move the transmission mask 20 horizontally in consonance with the position of selected transmission holes.

In response to a control signal from the pattern controller 55, a blanking control circuit 58 transmits a blanking signal SB to the blanking electrode 25 via the amplifier 59. The blanking electrode 25 controls the irradiation with an electron beam.

The sequence controller 60 receives drawing position data from the interface 53, and controls a drawing sequence. A stage moving mechanism 61 horizontally moves a stage 35 in consonance with a control signal from the sequence controller 60. The distance that the stage 35 is moved is detected by a laser interferometer 62, and is transmitted to a deflection control circuit 63. The deflection control circuit 63 supplies deflection signals S2 and S3 to the main deflector 33 and the sub-deflector 34 in accordance with the moving distance of the stage and the exposed position data, which is provided by the sequence controller 60. Generally, an electron beam is deflected by the main deflector 33 in a deflection field that is, for example, 2 to 20 mm square, while the beam is deflected by the sub-deflector 34 in a sub-field that is, for example, 100 μm square.

In FIG. 2, the detailed structure of the electron beam exposure apparatus that is shown differs from the structure in FIG. 1, with an oxygen supply device 8 supplying oxygen gas to chambers 2, 3a, 3c and 3b via mass flow sensors 2, 3, 4 and 5, respectively. A plasma is generated by providing a supply of oxygen and by connecting a high frequency generator (not shown) to the internal electrodes, and with this oxygen, the surfaces of the components are cleaned. In other words, activated oxygen is provided by generating a plasma, and contaminants are removed from the surfaces of the components by using the activated oxygen.

Figure 3:
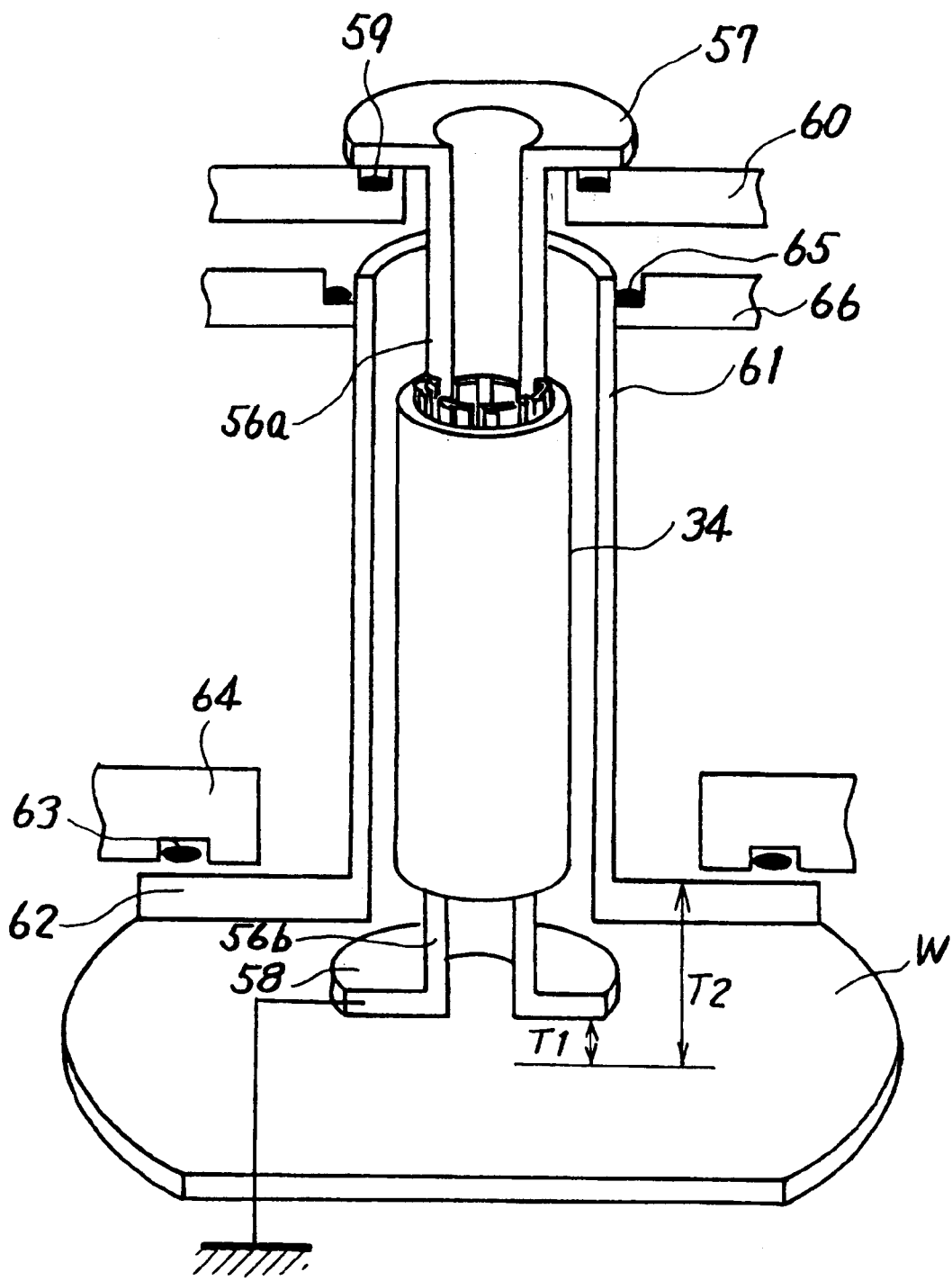
FIG. 3 is a diagram illustrating the arrangement of a sub-deflector and its periphery.

FIG. 3 is a diagram illustrating the arrangement of the sub-deflector 34 and its periphery. The sub-deflector 34 is a portion which directly faces the wafer W, a sample, and one of those wherein most contaminants tend to be deposited by a gas generated by a resist coated on the surface of the wafer W.

A cylindrical component 56a composed of insulating material is located on the sub-deflector 34. The cylindrical component 56a has a hollow, circular shape, and a flange 57 at its top end. The flange 57 is fixed to a frame member 60 of the exposure apparatus by an O ring 59. A cylindrical component 56b also composed of the insulating material is located under the sub-deflector 34, and has a flange 58 that is provided in the same manner. The flange 58 directly faces the wafer W, as a sample, and is positioned at the lowermost end of the mirror barrel. The flanges 57 and 58 are plated with a conductive film and are grounded.

The sub-deflector 34 is covered with another cylindrical item 61 that is formed of the insulating material. A flange 62 is located at the lower end of the cylindrical item 61, and is fixed to a frame member 64 by an O ring 63. In the cylindrical component 61 a vacuum is maintained. The frame members 60, 64 and 66 are formed of insulating material. The main deflector 33 shown in FIG. 2 is provided outside of the cylindrical item 61.

As for the sub-deflector 34, a plurality of pairs of electrically insulated electrodes are arranged inside a cylinder formed of insulating material. An electric field is distributed in an arbitrary direction by applying a voltage to one pair of opposing electrodes, and in this fashion an electron beam is deflected.

[Electrodes of an electrostatic deflector]

Figure 4:
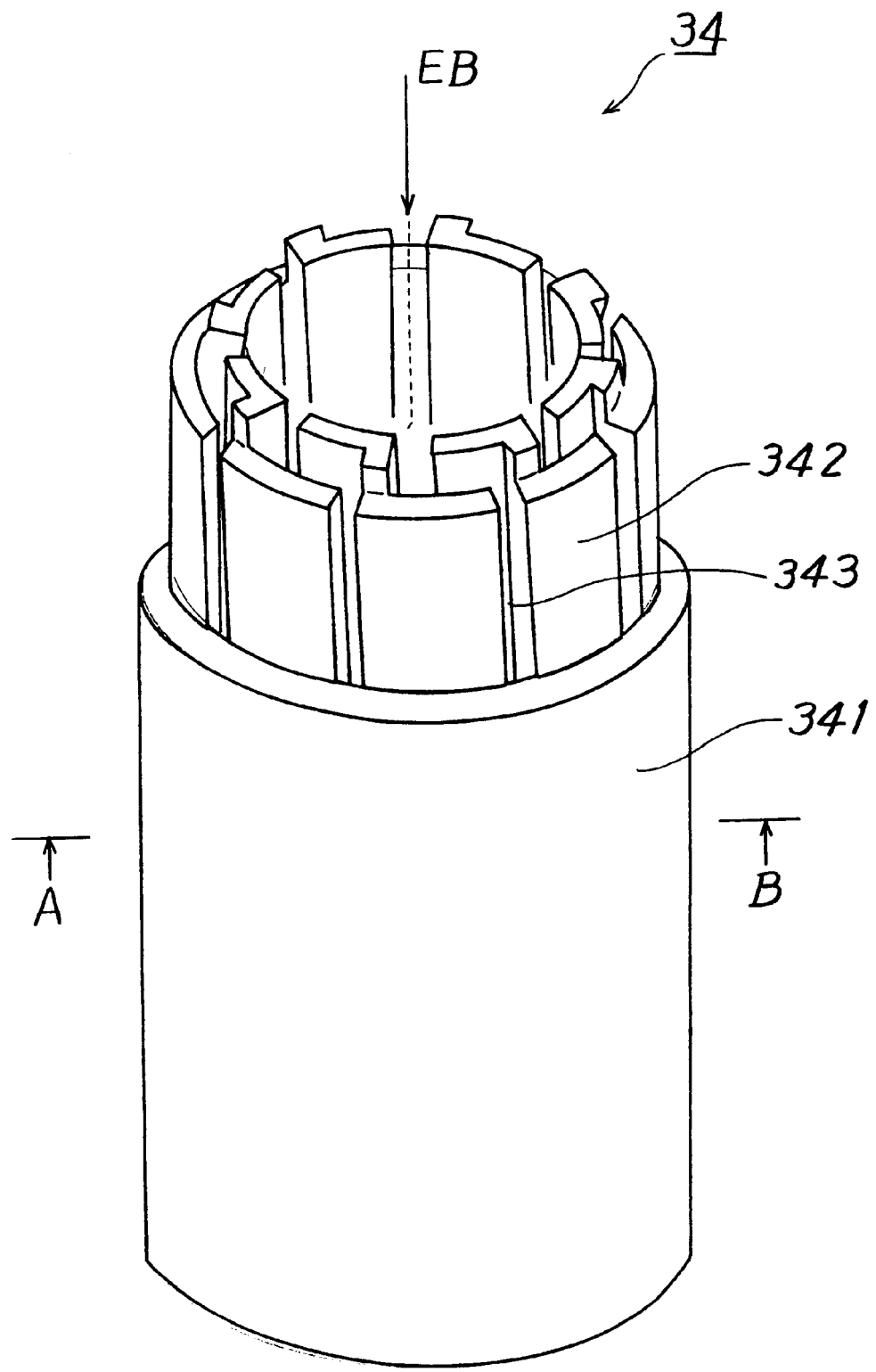
FIG. 4. is a perspective view of an example electrode structure of an electrostatic deflector according to the present invention.
Figure 5:
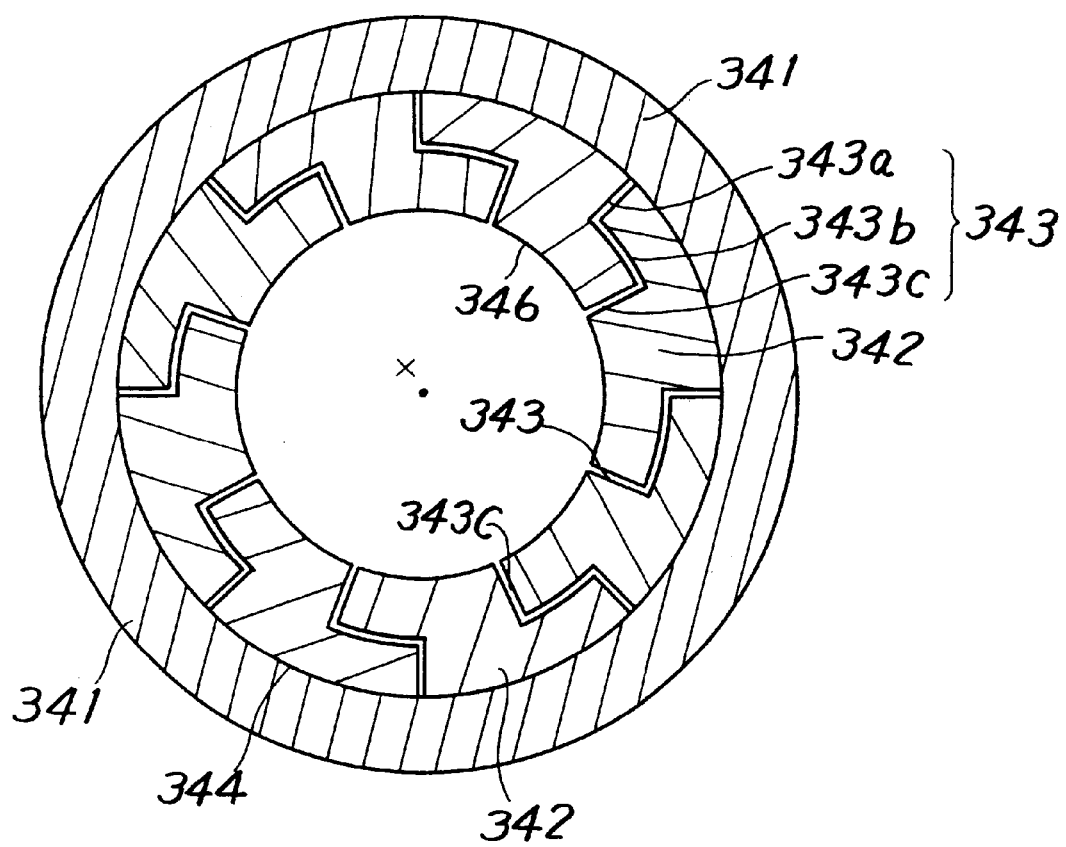
FIG. 5 is a cross sectional view taken along the line AB in FIG. 4.

FIG. 4 is a perspective view of the electrode structure of the electrostatic deflector 34 according to the present invention. FIG. 5 is a cross sectional view taken along the line AB in FIG. 4.

In the electrode structure, eight electrodes 342, made of a conductive material containing carbon as its primary element, are provided inside an insulating cylinder 341 made of an insulating material, such as ceramic. The conductive material is produced by shaping a mixture of carbon and a binder into a cylinder and firing it. The thus produced material is a glassy carbon wherein carbon crystals have become amorphous. Therefore, almost all, at least 90%, of the glassy carbon is carbon. GC20, a product name of Tokai Carbon Co., Ltd., is preferable as such glassy carbon.

Since the resistivity of carbon is approximately one hundred times greater than that of metal, an eddy current is not caused at the surfaces the electrodes of the conductive material, containing carbon as its primary element, even when the electrodes are affected by a magnetic field produced by the main deflector 33, i.e., the electromagnetic deflector. Further, since the plating of a metal film is not performed, the peeling of plating caused by sputtering will not occur, even as a result of conventional plasma cleaning.

According to this example of the electrode arrangement, a glassy carbon cylinder is fired and separation grooves 343 are formed by the electron discharge method, so that the insulation-separated eight electrodes 342 are provided. As is apparent from the cross sectional view in FIG. 5, each of the separation grooves 343 is constituted by groove segments 343a and 343c extending from the center axis X of the cylinder toward the radius, and a groove segment 343b extending in the circumferential direction so as to link together the groove segments 343a and 343c. The shape of the separation groove 343 can be variously modified. It is preferable that the exposed internal face of the insulating cylinder 341 be separated as far as possible, via the separation grooves 343, from the center portion through which an electron beam is projected. In addition it is preferable that the ratio of the depth of the separation groove 343 to its width (aspect ratio=depth/width) be as great as possible.

This is because, with the above electrode arrangement, it is required, even if a charge buildup (accumulation of a charge) occurs at the insulating portion of the internal face of the insulating cylinder 341 that is exposed by forming the separation grooves 343, an electric field due to the charge buildup will not affect the center area through which an electron beam passes.

A method for manufacturing the electrode arrangement will now be explained while referring to FIGS. 6 through 9.

Figure 6:
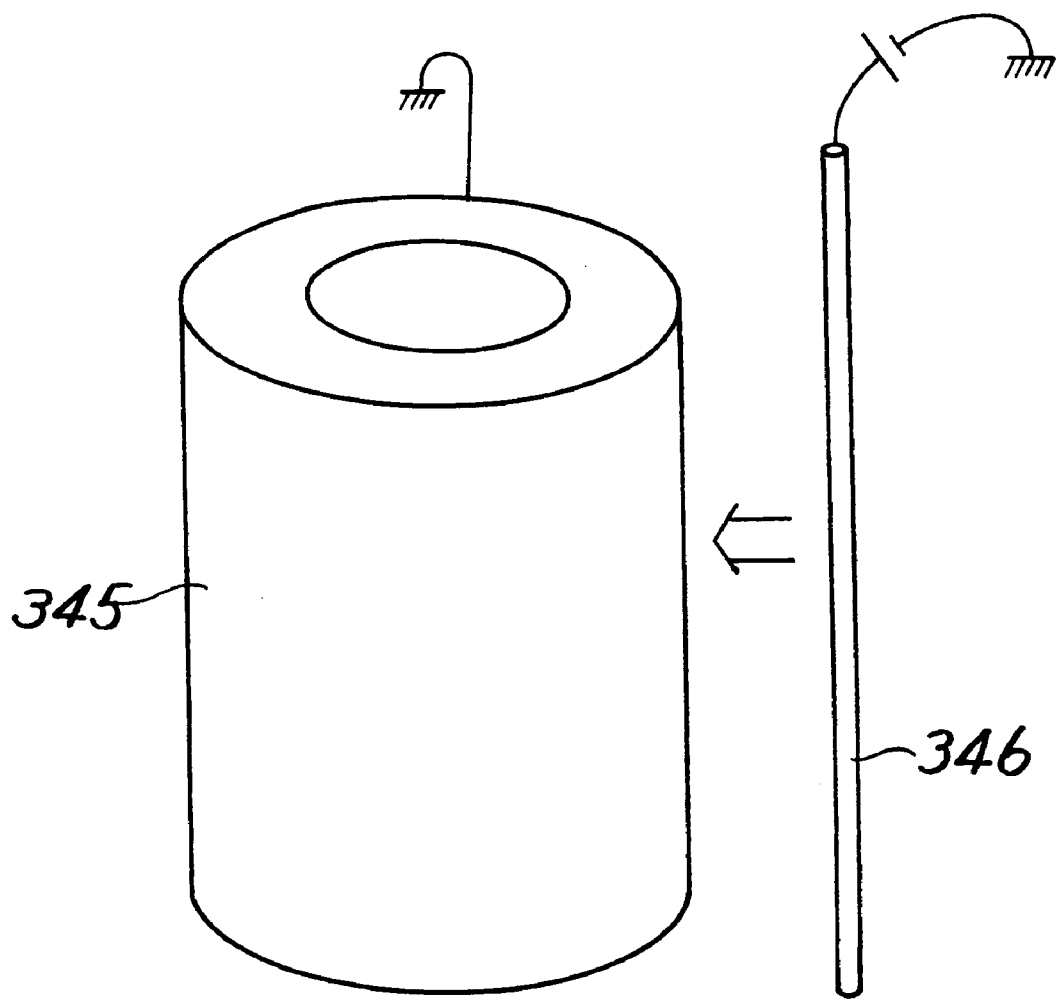
FIG. 6 is a diagram for explaining a method for manufacturing electrostatic deflection electrodes.

First, glassy carbon solidified by mixing it with a binder is extruded, dried, and fired to provide a cylindrical pipe 345 shown in FIG. 6. L-shaped grooves are formed first in the outer surface of the pipe 345 by the electron discharge method, wherein a discharge is generated by bringing a metal line 346 into contact with the pipe 345 while at the same time applying a high voltage to the metal line 346.

Figure 7:
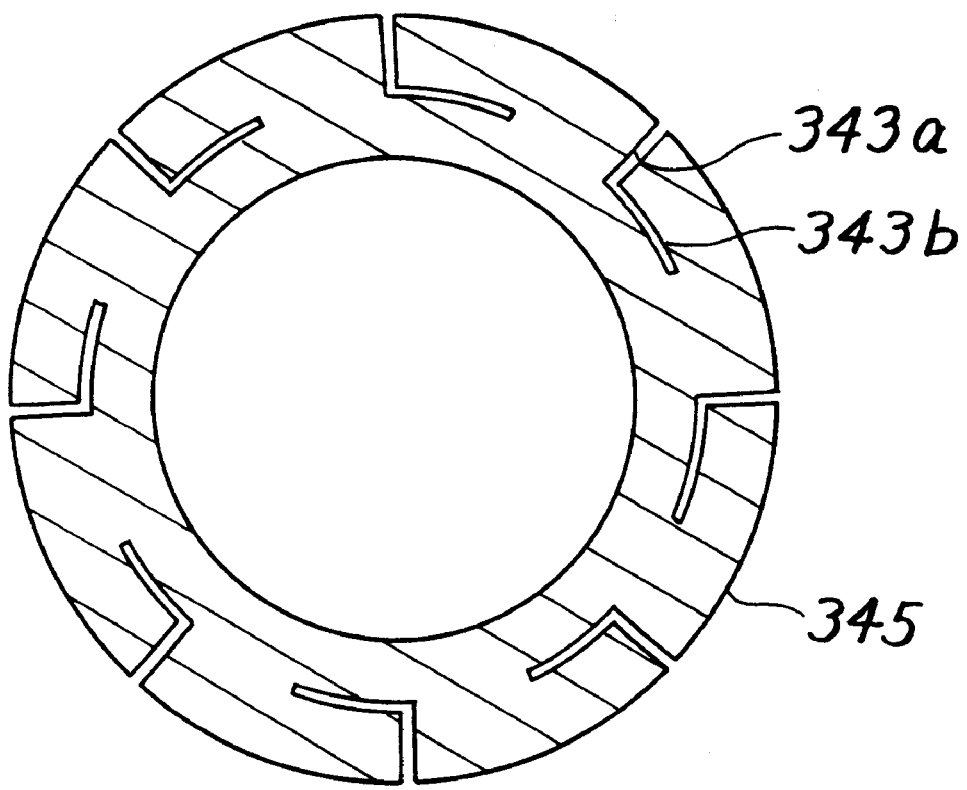
FIG. 7 is a diagram for explaining the method for manufacturing the electrostatic deflection electrodes.

FIG. 7 is a cross sectional view of the pipe 345 in which are formed eight of the L-shaped grooves comprising segments 343a and 343b. The groove segment 343a is so formed that it extends inward from the outer surface of the pipe 345 along the line of the radius, and the groove segment 343b is so formed that it extends from the groove segment 343a in the circumferential direction.

Figure 8:
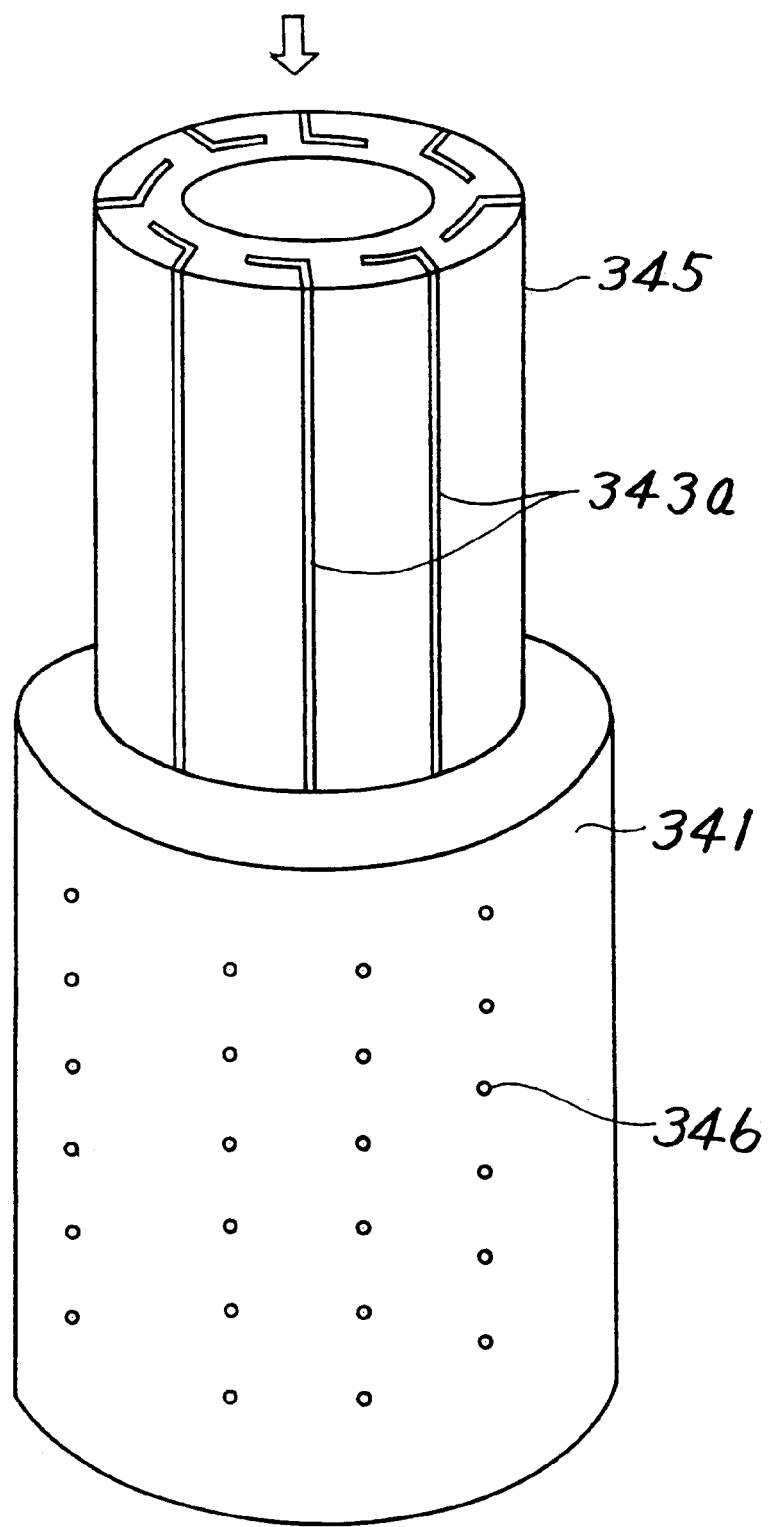
FIG. 8 is a diagram for explaining the method for manufacturing the electrostatic deflection electrodes.
Figure 9:
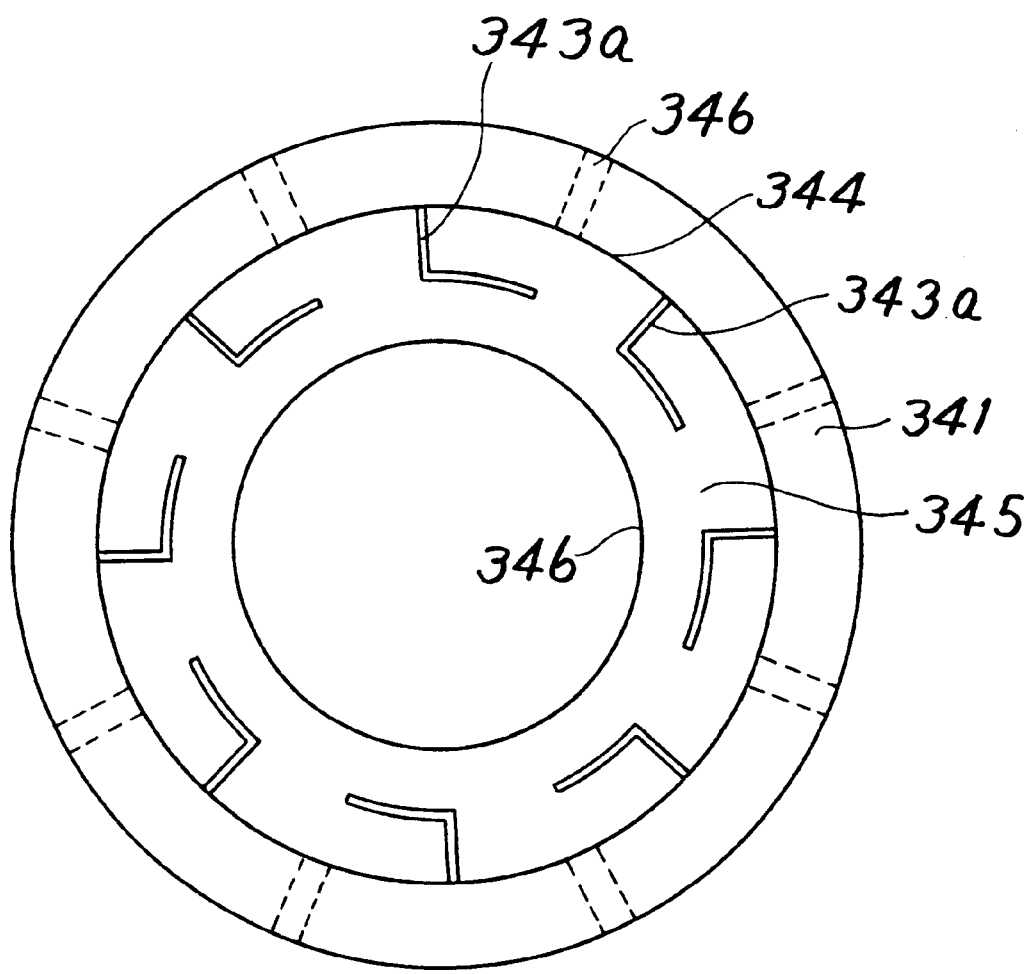
FIG. 9 is a diagram for explaining the method for manufacturing the electrostatic deflection electrodes.

Sequentially, as is shown in FIG. 8, the conductive pipe 345 is inserted into the insulating cylinder 341, which is made of a ceramic containing alumina ($Al_2O_3$) as its primary element. A plurality of holes 346 formed in the insulating cylinder 341 are linearly arranged in the axial direction. The conductive pipe 345 is so inserted that the groove segments 343a are located between the holes 346 that are arranged in the axial direction, as is shown in FIG. 9.

An adhesive is applied through the holes 346 to bond the insulating cylinder 341 to the conductive pipe 345. Reference numeral 344 in FIG. 9 denotes a bonded face. It is preferable that the adhesive not spread to the groove segments 343a.

An internal face 346 of the conductive pipe 345 is ground so as to be coaxially formed relative to the external diameter of the insulating cylinder 341 and so as to form a true circle. Since separations are later formed in the conductive pipe 345 to provide eight electrodes, and a distribution of an electric field is provided upon the application of a voltage to each pair of opposing electrodes, it is necessary to accurately locate the faces of the opposing electrode pairs in order to provide the precise electric field distribution.

Using the electron discharge method shown in FIG. 6, the groove segments 343c shown in FIG. 5 are formed extending outward from the internal face 346 of the conductive pipe 345 along the radius, and the eight separate deflection electrodes are thereby provided. Since the separate deflection electrodes are bonded to the insulating cylinder 341 at the bonding face 344 by an adhesive, they maintain their relative positions.

As is described above, the pipe made of a conductive material is shaped and fired, and the resultant pipe is inserted into and fixed to the insulating cylinder 341. The internal face of the pipe is ground so that it is coaxially formed with the insulating cylinder 341 and so that it forms a true circle. Thereafter the groove segments 343a are formed in the internal face by the electron discharge method to divide the pipe into electrodes. Therefore, even when a change in the shape or a twisting of the body occurs during the shaping and firing of the conductive pipe 345, the shape of the internal face of the electrodes that is finally produced will conform to design values. As a result, an electrostatic deflector can be provided that ensures the electrodes are symmetric and that has excellent deflection accuracy.

Further, with the above described manufacturing method, first the separation groove segments 343a and 343b are formed from the external side of the conductive pipe 345, and then the separating grooves segments 343c are formed from the inside and link up with the groove segments 343b.

Therefore, during electron discharge processing, carbon flakes generated during the formation of the separation grooves will not remain on the internal face of the insulating cylinder 341, or the electrodes 342 will not be formed by insufficient separation of the pipe 345.

Figure 10:
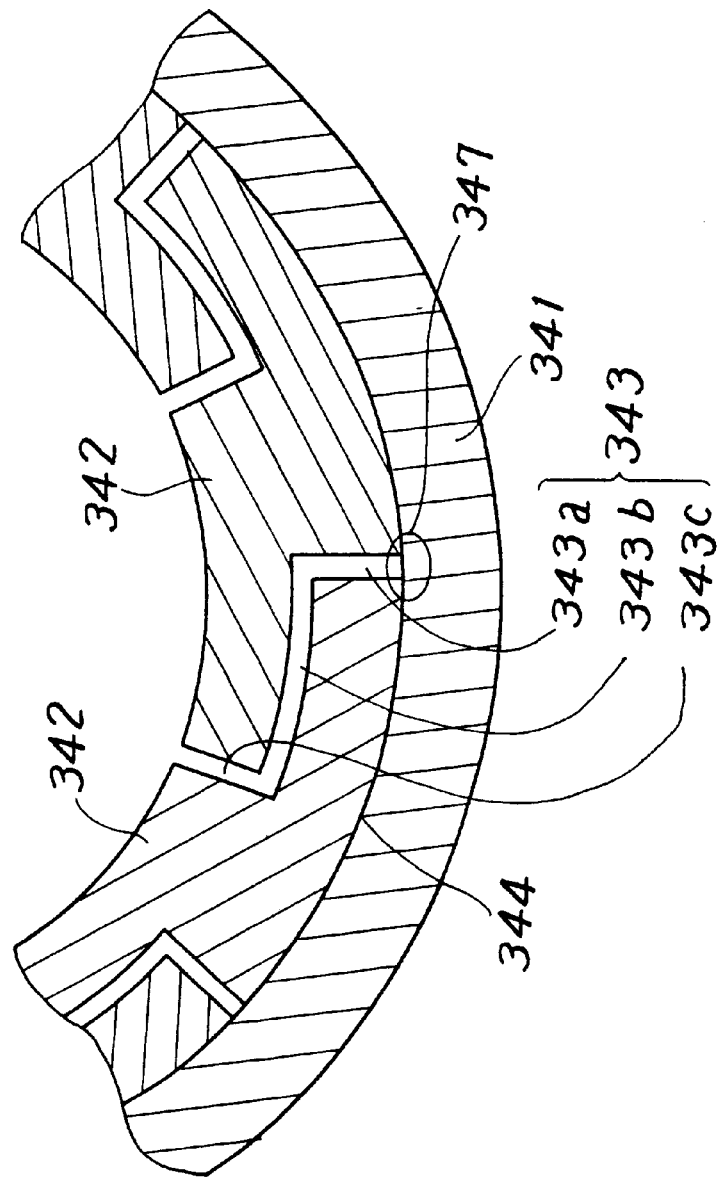
FIG. 10 is an enlarged cross sectional view of the deflection electrodes that are finally produced.

FIG. 10 is an enlarged cross sectional view of the deflection electrodes that are finally produced. When the separation grooves 343 are formed from the inside by the electron discharge method after the pipe 345 is inserted into the insulating cylinder 341, it is expected that at a portion 347 in FIG. 10, the pipe 345 will be insufficiently separated, or that carbon flakes will be attached and remain. Such a phenomenon causes insufficient insulative separation and a charge buildup in the attached carbon. Such a phenomenon will not occur when the above described manufacturing method is used.

In addition, the aspect ratio (depth of the groove/width) of the separation groove 343 is large, for example at least 5:1. Even if the reflected electrons that accompany the irradiation of the electron beam EB reach the bottom of the separation grooves 343 and cause a charge buildup at the portion 347 in FIG. 10, the influence of the charge buildup on the electric field is dissipated by the deep separation grooves 343, and the change buildup has no effect on the portion that is irradiated to the electron beam EB. In other words, the electric field produced by a charge is confined within the separation grooves 343. In the above embodiment, further, since the separation grooves 343 are bent at two places, a great shielding field effect is obtained.

In FIGS. 11 through 15 are shown different example shapes for the electrostatic deflection electrodes. These electrode structures are the same as that wherein the electrodes are formed by inserting the conductive pipe 345, containing carbon as its primary element, into the insulating cylinder 341. The differences between these electrodes structures are the shapes of the separation grooves 343. Although the shapes of the separation grooves 343 differ, however, the internal faces 346 of the separated electrodes comprise eight arcs, which are obtained by equally dividing the internal circle.

Figure 11:
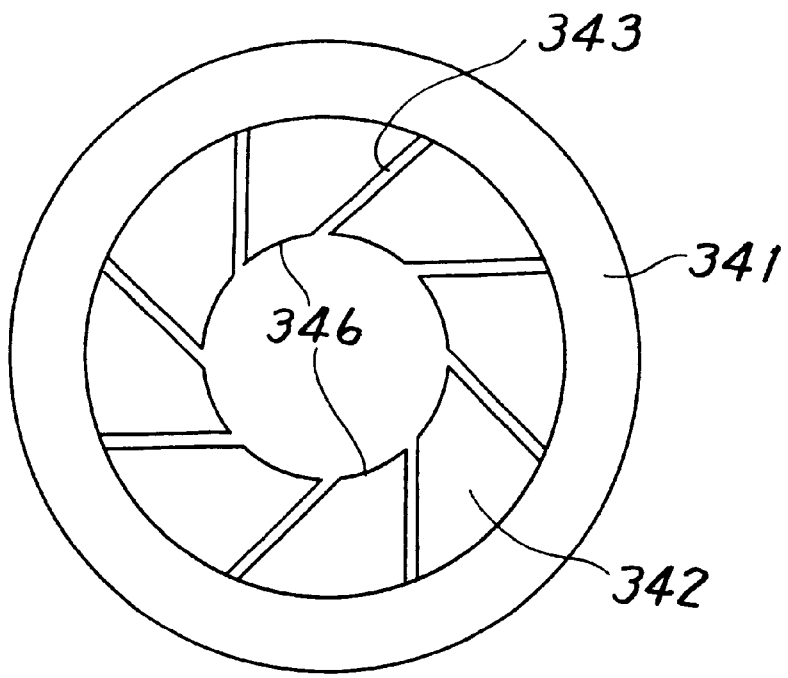
FIG. 11 is a cross sectional view of an example of electrostatic deflection electrodes having a different shape.

In the example in FIG. 11, separation grooves 343 are shaped so that they incline toward the radius. As was previously described, the aspect ratio is sufficiently great that even if charges are accumulated at the internal face of the insulating cylinder 341, at the bottoms of the separation grooves, the shielding effect provided by the grooves 343 is sufficient to prevent the electron beam from being affected by the electric fields. Further, the aspect ratio of the separation grooves 343 is increased by the equivalent of the inclination. As was previously described, first, the segment of the separation groove 343 is formed from the external face up to the middle of the pipe 345. Then, after the pipe 345 is inserted into the insulating cylinder 341, the other segment of the separation groove 343 is formed from the inside of the pipe 345, so that it is linked up with the groove segment formed from the external face.

Figure 12:
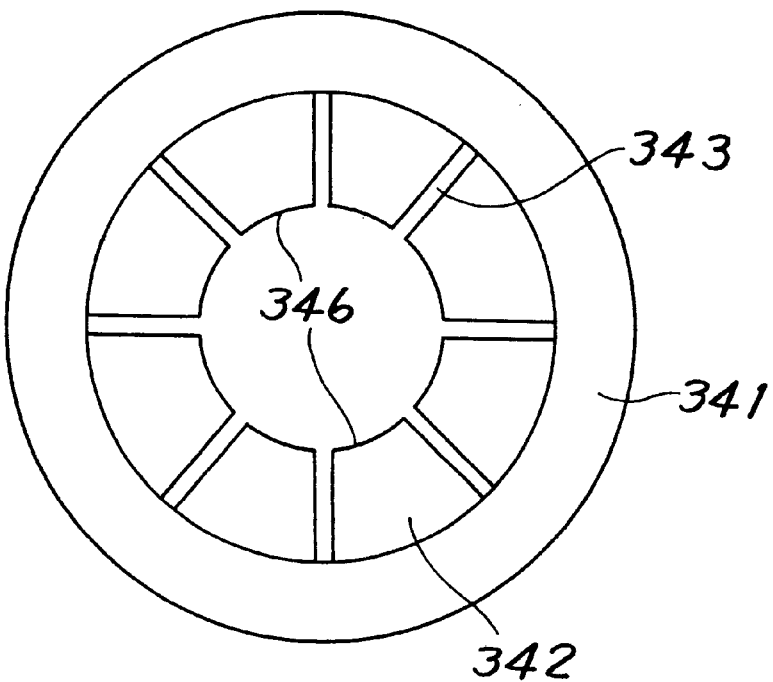
FIG. 12 is a cross sectional view of another example of electrostatic deflection electrodes having a different shape.

The example shown in FIG. 12 shows separation grooves 343 formed linearly along the radius. With the separation groove 343 that has a small diameter, an adequate shielding effect can be obtained. The formation of the separation grooves 343 is easy.

Figure 13:
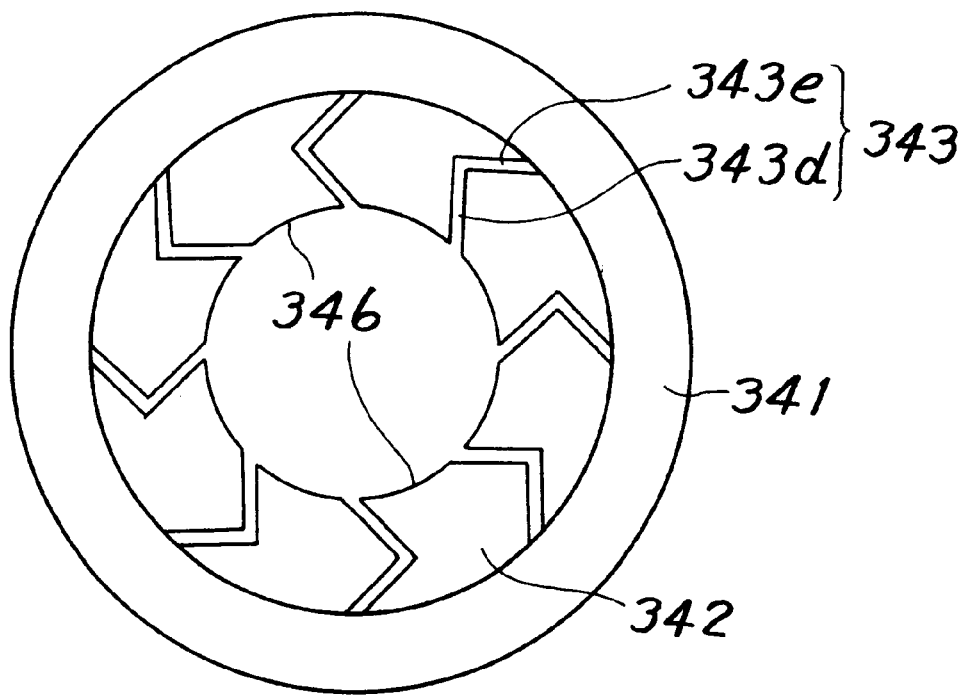
FIG. 13 is a cross sectional view of an additional example of electrostatic deflection electrodes having a different shape.

The example in FIG. 13 shows L-shaped separation grooves 343. A separation groove segment 343e is formed from the outer face of a conductive pipe 345 and a separation groove 343d is formed from the inside.

Figure 14:
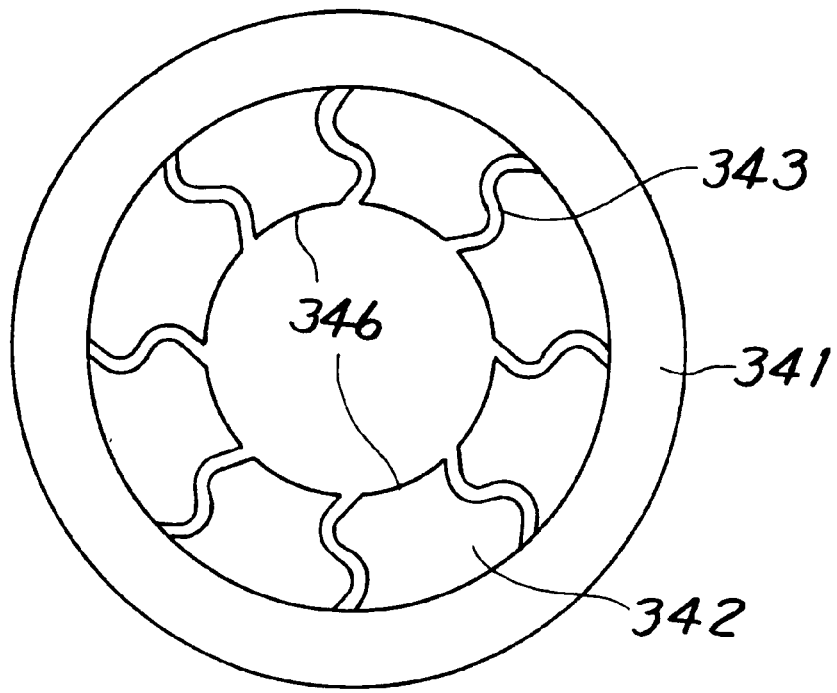
FIG. 14 is a cross sectional view of a further example of electrostatic deflection electrodes having a different shape.

The example shown in FIG. 14 shows S-shaped separation grooves 343. One half of the separation groove 343 is formed from the outer surface of the conductive pipe 345 and the other half of the separation groove 343 is formed from the inside the pipe 345. The grooves 343 having an S shape provide a great shielding effect.

Figure 15:
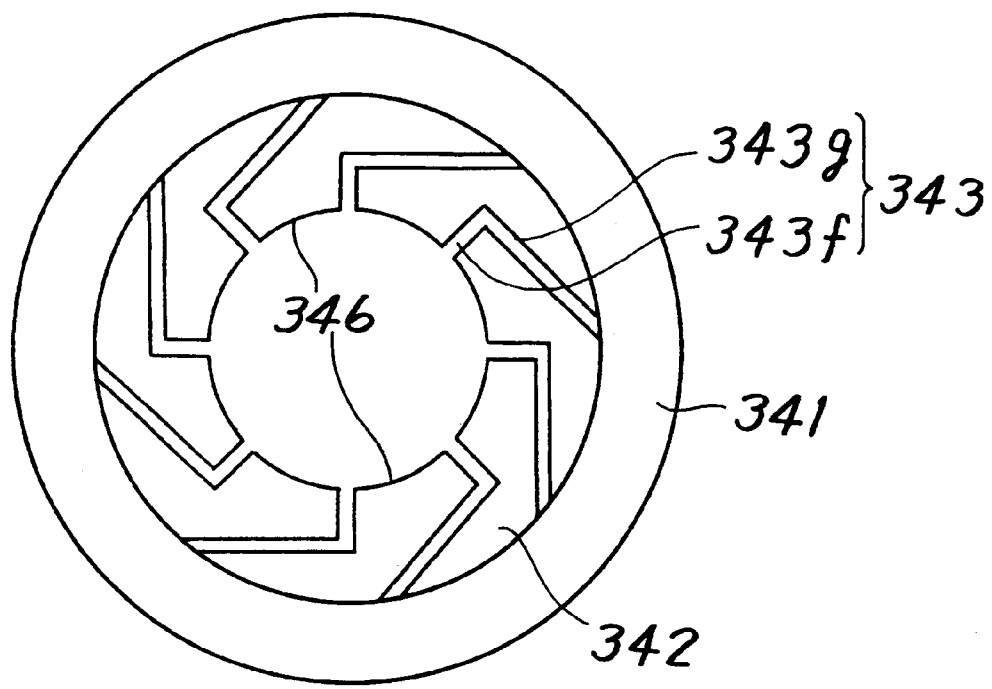
FIG. 15 is a cross sectional view of yet another example of electrostatic deflection electrodes having a different shape.

The example in FIG. 15 shows L-shaped separation grooves 343. A separation groove segment 343f, close to the internal face of the electrode 342, is extended along the radius and a separation groove segment 343g, close to the outer face, is extended perpendicularly from the groove segment 343f. These segments 343f and 343g are formed respectively from the outer face and the internal face.

Various other modifications can be employed for the electrode structure. The principle of the present invention is that electrostatic deflection electrodes, at the surfaces of which an eddy current does not occur and which are highly resistant to damage during plasma cleaning, are highly accurately formed and sized by a process during which a pipe is formed of a conductive material containing carbon as its primary element and is inserted to an insulating cylinder, and the internal face of the conductive pipe is then shaped and separation grooves are formed from the inside for insulative separation of the pipe. Therefore, modifications of the electrode shapes that fall within the scope of the principle of the invention correspond to the technical scope of the present invention.

As is described above, according to the present invention, since electrostatic deflection electrodes are formed of a conductive material containing carbon as a primary element, the resistivity of which is higher than that of metal, an eddy current does not occur on the electrodes, even though there are changes in a magnetic field produced by an electromagnetic deflector, which is located outside the electrostatic deflector. Therefore, the electrostatic deflector of the present invention satisfactory serves as a sub-deflector for deflecting a beam at high speed.

Further, since electrodes are formed of a conductive element containing carbon, the conventional problems that occur when plasma etching is used to clean the interior, such as the scoring of electrode surfaces and the peeling away of plated electrode layers, are eliminated. In addition, even when cleaning using ozone is performed, the surfaces of carbon electrodes are scored at most on the order of $\mu$m. Further, during plasma cleaning using oxygen, the surfaces of the electrodes are abraded only on the same order. As a result, the condition of the electrostatic deflection electrodes can be maintained for a long time.

Furthermore, since after the conductive material is shaped and fired, the internal face is again processed to increase its coaxial accuracy and to form it into a true circle, and then the electrode separation grooves are formed, the sizing of the internal faces of the electrodes is very accurately performed, and deflection accuracy is enhanced.

What is claimed is:

1. A method for manufacturing an electrostatic deflector, provided in a charged particle beam exposure apparatus which deflects a charged particle beam which is formed into a predetermined shape by being passed through a predetermined mask, and irradiates the charged particle beam to a predetermined location on a surface of a sample, comprising:

shaping a conductive material containing carbon as a primary element into a cylinder and firing the cylinder to form a conductive pipe;

forming external grooves having a predetermined shape which extend from an external face of the conductive pipe to an internal position within the conductive pipe;

inserting the conductive pipe into an insulating cylinder and fixing the conductive pipe therein;

grinding an internal face of the conductive pipe so as to give the internal face a substantially cylindrical shape; and forming internal grooves which extend from the internal face of the conductive pipe to the external grooves, and with which the conductive pipe is separated into a plurality of pairs of electrodes.

2. A method for manufacturing an electrostatic deflector according to claim 1, wherein;

said external groove has a first groove segment formed in extending in a direction inward from the external face of the conductive pipe and a second groove segment extending from the first groove segment in a circumferential direction of the insulating cylinder, said internal groove has a third groove segment extending from the internal face of the conductive pipe to the second groove segment in the direction of the radius.

3. A method for manufacturing an electrostatic deflector according to the claim 1 wherein;

said external grooves and internal grooves are formed by an electron discharge method, in which a discharge is generated between a line brought into contact with the conductive pipe and the conductive pipe.

* * * * *